(12) United States Patent
Mittal et al.

(10) Patent No.: US 11,048,443 B1
(45) Date of Patent: Jun. 29, 2021

(54) NON-VOLATILE MEMORY INTERFACE

(71) Applicant: SanDisk Technologies LLC, Addison, TX (US)

(72) Inventors: Sajal Mittal, Bangalore (IN); Sneha Bhatia, Bangalore (IN); Vinayak Ghatawade, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/830,128

(22) Filed: Mar. 25, 2020

(51) Int. Cl.
| | | |
|---|---|---|
| *G11C 16/10* | (2006.01) |
| *G06F 3/06* | (2006.01) |
| *G06F 13/16* | (2006.01) |
| *G11C 16/26* | (2006.01) |
| *G11C 16/08* | (2006.01) |
| *G06F 1/06* | (2006.01) |
| *G11C 16/04* | (2006.01) |

(52) U.S. Cl.
CPC .............. *G06F 3/0659* (2013.01); *G06F 1/06* (2013.01); *G06F 3/0604* (2013.01); *G06F 3/0679* (2013.01); *G06F 13/1668* (2013.01); *G11C 16/08* (2013.01); *G11C 16/10* (2013.01); *G11C 16/26* (2013.01); *G11C 16/0483* (2013.01)

(58) Field of Classification Search
CPC ....................................... G11C 16/10
USPC ..................................... 365/185.28
See application file for complete search history.

(56) References Cited

U.S. PATENT DOCUMENTS

| | | |
|---|---|---|
| 5,835,936 A | 11/1998 | Tomioka et al. |
| 7,802,061 B2 | 9/2010 | Qawami et al. |
| 8,316,174 B2 | 11/2012 | Cohen et al. |
| 8,953,396 B2 | 2/2015 | Abedifard |
| 9,159,438 B2 | 10/2015 | Im |
| 10,120,591 B2 | 11/2018 | Jeon |
| 2016/0019171 A1 | 1/2016 | Shaeffer |
| 2018/0102344 A1* | 4/2018 | Ramachandra ......... H01L 25/18 |
| 2019/0243700 A1 | 8/2019 | Brewer |

* cited by examiner

*Primary Examiner* — Jason Lappas
(74) *Attorney, Agent, or Firm* — Vierra Magen Marcus LLP

(57) ABSTRACT

A circuit comprising a non-volatile memory array, an Input/Output (IO) circuit, a decoder circuit, a control circuit, and a read/write circuit. The non-volatile memory array couples to an address decoder that identifies a location within the non-volatile memory array for a storage command. The IO circuit couples to a decoder circuit through a control bus. The decoder circuit decodes a command address and storage command from a fixed length command sequence received by the IO circuit over the data bus. The decoder circuit may include a serial-in parallel out (SIPO) circuit for decoding and parallel operation. The control circuit couples to the IO and decoder circuits and generates control signals to execute decoded storage commands. The read/write circuit couples to the non-volatile memory array and the control circuit. The read/write circuit transfers data between the non-volatile memory array and the IO circuit in response to the storage commands.

20 Claims, 8 Drawing Sheets

NON-VOLATILE MEMORY INTERFACE

BACKGROUND

Low latency flash memory currently processes and stores the large amounts of data generated in today's digital word. In designing low latency flash memory, aspects of design and functionality are examined for opportunities to further reduce latency, including read times, write high to read times, command and address (CA) times, decoding times for commands and addresses, etc.

Conventional CA processing methods may be a bottleneck for use with high speed read operations in low latency flash memory. Transfer time of the command data and address data is too slow and decoding of the command data and address data using conventional decoders takes too long. This is in part due to implementation of a number of protocols such as toggle mode and open NAND flash interface (ONFI), which use command sequences of variable length. Interpreting commands that come with a variable number of bytes, of variable length, necessitates a separate control line to signal when the command portion of a transmission begins and ends, and when an addressing portion begins and ends. Furthermore, conventional protocols may use two or more clock signals. For example, in certain protocols one clock signal may be used for the transfer of data and a separate, possibly slower, clock signal may be used for transfer of the command data (the command instructions itself) and address data.

CA transfer time should account for specific setup and hold times needed by the decoder to latch the CA data. Given a setup time and hold time constraint and maximum operation speed for a decoder, providing faster CA instructions is not helpful if the decoder cannot process them. Conventional devices send CA using single data rate (SDR) and a separate control line (i.e., a write enable or WEx control line) as a clock for the CA. The WEx clock period may be 10 ns, resulting in a CA transfer time ranging from 70 ns to 100 ns. The variation in transfer time is due to the variable length CA command sequence.

A solution is needed to improve CA data transfer time and decoding speed for CA data, thereby providing additional latency reductions for low latency flash memory.

BRIEF SUMMARY

This disclosure relates to a circuit comprising a non-volatile memory array, an Input/Output (IO) circuit, a decoder circuit, a control circuit, and a read/write circuit. The non-volatile memory array is coupled to an address decoder. The address decoder identifies a location within the non-volatile memory array for a storage command. The IO circuit is coupled to a data bus. The decoder circuit is coupled to a control bus and the IO circuit. The decoder circuit decodes a command address and storage command from a fixed length command sequence received by the IO circuit over the data bus. The control circuit is coupled to the IO circuit and decoder circuit. The control circuit generates control signals to execute the storage commands decoded by the decoder circuit. The read/write circuit is coupled to the non-volatile memory array and the control circuit. The read/write circuit transfers data between the non-volatile memory array and the IO circuit in response to the storage commands.

This disclosure further relates to a system comprising a plurality of memory dies and a storage controller. Each of the memory dies couples to a memory interface comprising a data bus and a control bus. The storage controller couples to the memory dies through the memory interface. The storage controller comprises an interface manager that transfers data and a fixed length command address sequence to the memory dies using the memory interface. The memory dies each include a die controller with a die interface manager that communicates with the storage controller over the memory interface. The storage controller interface manager and the die interface managers transfer the fixed length command address sequence over the data bus using a double data rate protocol. The data bus comprises a clock signal configured to operate at a speed of 2 nanoseconds per clock cycle.

Lastly, this disclosure relates to a method that may be implemented by the disclosed circuit and system. First, a fixed length command sequence is received from a storage controller using a double data rate protocol over a data bus in response to a command control signal. The command control signal identifies whether the data bus is carrying a storage command or data. The fixed length command sequence is then decoded to determine the storage command identified by the fixed length command sequence. Finally, the identified storage command is executed.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
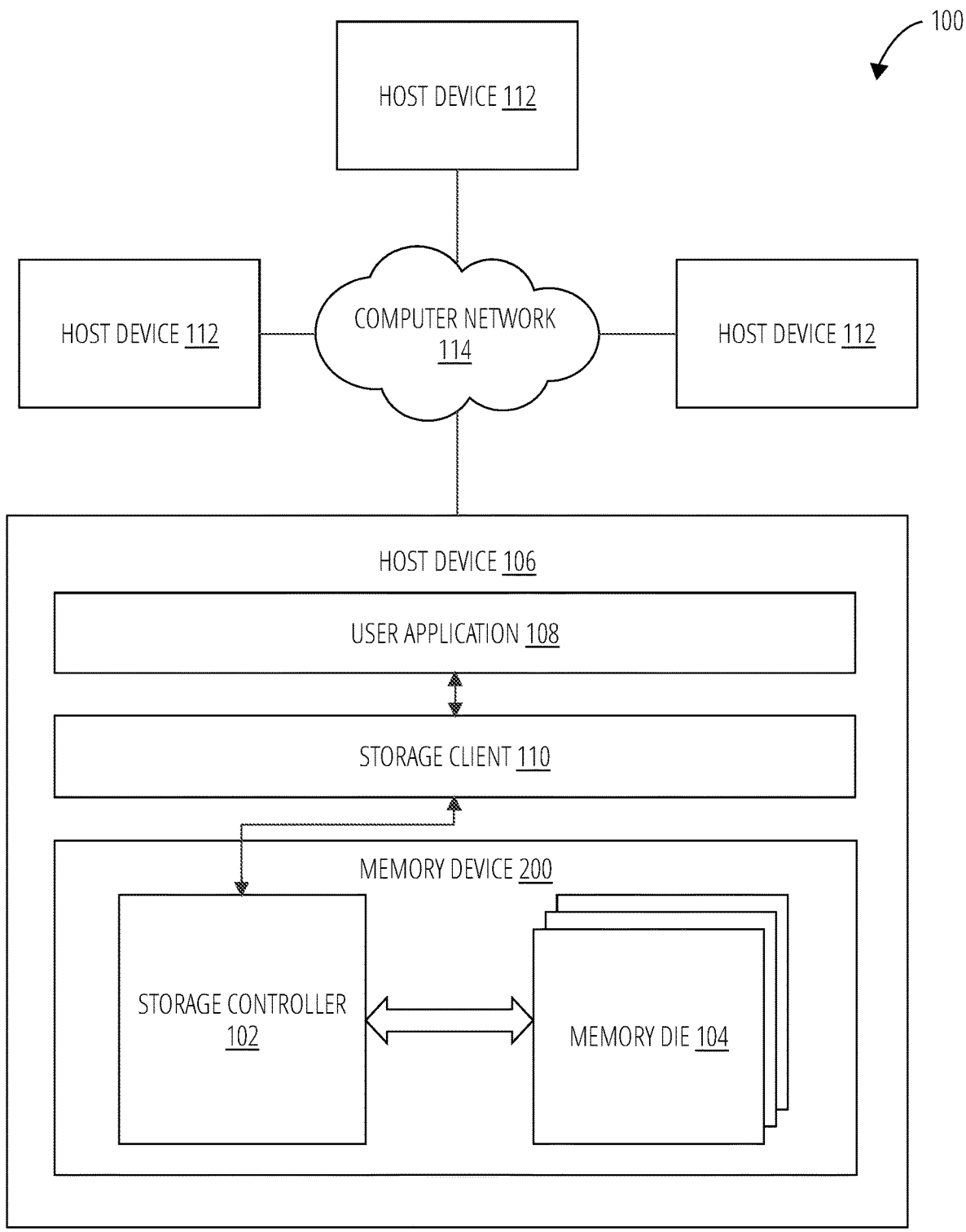
FIG. 1 illustrates a system 100 in accordance with one embodiment.

This disclosure relates to a solution for improving latency due to command sequence, specifically command address sequence (CA) decoding in low latency flash memory. "Command sequence" refers to a set of bytes of data configured to represent a command, or instruction, for a receiver of the command sequence. In certain embodiments, a command sequence includes a location, or command address, that applies to the command, or instruction, communicated in the command sequence. In such embodiments, the command sequence may be referred to as a command address sequence. "Command address sequence" refers to a command sequence that includes both a storage command and a command address for the storage command. Embodiments of the solution include a fixed length command sequence for transferring a command address sequence from a controller to a receiver. The fixed length command sequence is used in place of using a variable length/size command sequence.

"Storage command" refers to any command relating to a storage operation. Examples of storage commands include, but are not limited to, read commands, write commands, maintenance commands, configuration command, administration command, diagnostic commands, test mode commands, countermeasure command, and any other command a storage controller may receive from a host or issue to another component, device, or system. "Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

"Memory" refers to any hardware, circuit, component, module, logic, device, or apparatus configured, programmed, designed, arranged, or engineered to retain data. Certain types of memory require availability of a constant power source to store and retain the data. Other types of memory retain and/or store the data when a power source is unavailable.

"Non-volatile memory array" refers to a set of non-volatile storage cells (also referred to as memory cells or non-volatile memory cells) organized into an array structure having rows and columns. A memory array is addressable using a row identifier and a column identifier.

"Storage block" refers to a set of storage cells organized such that storage operations can be performed on groups of storage cells in parallel. The organization of the set of storage cells may be implemented at a physical level or a logical level. Thus, a storage block, in one embodiment, may comprise a physical page, such as a word line, a logical page comprising physical pages that span planes and/or memory die, a physical erase block comprising a set of physical pages, a logical erase block (LEB) comprising a set of logical pages, or the like. A storage block may be referred to herein as a "block", a "memory block" or a LEB.

"Storage cell" refers to a type of storage media configured to represent one or more binary values by way of a determinable characteristic of the storage media when the storage media is sensed, read, or detected to determine the binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Threshold" refers to a level, point, magnitude, intensity, or value above which a condition is true or will take place and below which the condition is not true or will not take place. (Search "threshold" on Merriam-Webster.com. Merriam-Webster, 2019. Web. 14 Nov. 2019. Edited)

"Storage media" refers to any physical media organized and configured to store one or more bits of data. In one embodiment, storage media refers to physical storage cells and/or memory cells used in volatile memory media. In another embodiment, storage media refers to physical storage cells and/or memory cells used in non-volatile memory media.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

In certain embodiments, data stored in volatile memory media is addressable at a byte level which means that the data in the volatile memory media is organized into bytes (8 bits) of data that each have a unique address, such as a logical address.

In certain embodiments, a fixed length command sequence may be employed comprising an address field, a command field, one or more command prefix fields, and one or more command suffix fields, which together fit within a fixed total size. "Command address" refers to an address within a non-volatile memory array associated with a storage command. If a storage command is a read command, the command address is the address of the byte, logical page, physical page, data block, and/or storage block from which data is to be read. If a storage command is a write/program command, the command address is the address of the byte, logical page, physical page, data block, and/or storage block or offset therein at which data for the write/program command is to be written/stored. If a storage command is a maintenance command, such as an erase command, the command address is the address of the physical erase block, logical erase block, and/or storage block which is to be erased.

"Decoder" refers to any hardware, device, component, element, or circuit configured to interpret signals on a communication line such as a data line and/or a control line. In certain embodiments, a decoder is configured to interpret the signals as a data value configured to represent a command such as a storage command. Alternatively, or in addition, the decoder may be configured to interpret the signals as a data value configured to represent a location or an address such as a command address. Alternatively, or in addition, the decoder may be configured to interpret the signals as a data value configured to represent data that is stored on or retrieved from a storage media, such as a non-volatile storage media. "Hardware" refers to logic embodied as analog and/or digital circuitry.

"Non-volatile storage media" refers to any hardware, device, component, element, or circuit configured to maintain an alterable physical characteristic used to represent a binary value of zero or one after a primary power source is removed. Non-volatile storage media may be used interchangeably herein with the term non-volatile memory media.

The fixed length command sequence may be sent to an addressed memory die using double data rate (DDR) protocol. "Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search die (integrated circuit) on Wikipedia.com Oct. 9, 2019. Accessed Nov. 18, 2019.) A memory die is a die, in one embodiment, that includes a functional circuit for operating as a non-volatile memory media and/or a non-volatile memory array.

"Non-volatile memory media" refers to any hardware, device, component, element, or circuit configured to maintain an alterable physical characteristic used to represent a binary value of zero or one after a primary power source is removed.

"Double data rate protocol" refers to a communication bus protocol configured to transfer data from a sender to a receiver on both a rising edge and a falling edge of a clock signal or strobe signal. A double data rate protocol may be abbreviated "DDRx" where x represents the generation for the protocol (e.g., DDR2 is a 2nd generation double data rate protocol). A double data rate protocol may also be referred to as a "double pumped", "dual-pumped", "double transition" protocol. A double data rate protocol may also be referred to as a toggle mode, particularly when used with a memory interface.

A double data rate protocol is configured and capable of transferring twice as much data as a single data rate protocol (abbreviated "SDR"), which is configured to transfer data on either a rising edge or a falling edge of a clock signal.

The fixed length command sequence size may be fixed at 10 bytes. A clock speed of 2 ns per cycle may be used, such that each CA command sequence takes 20 ns to be sent to the receiving device. Some embodiments may use both a non-read command decoder and a read command decoder each configured to generate the internal control signals that operate the memory die non-volatile memory array.

A serial-in parallel out (SIPO) circuit may be implemented to enable parallel processing of the fixed length command sequence and handle them in parallel. The SIPO circuit has a 16 bit input and an 80 bit output. The SIPO circuit serves to manage speed differences between transferring of the fixed length command sequences using the double data rate protocol and the operation speeds used by the non-read command decoder and read command decoder. In this manner, because the SIPO circuit is 16 bit input and 80 bit output, a 10 byte fixed length command sequence (with 8 bits per byte, thus, 80 bits) may be moved from a serial bus to an 80-bit parallel bus, such that all 80 bits of the fixed length command sequence may be processed in parallel to improve CA decoding latency. A circuit, system, and method that may be used to implement this solution is described in detail below.

FIG. 1 is a schematic block diagram illustrating one embodiment of a system 100 for improving performance in a solid-state storage device in accordance with the disclosed solution. The system 100 includes a memory device 200, a host device 106, at least one host device 112, and a computer network 114, which are described below.

In one embodiment, the host device is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the storage controller 102 to perform the methods described herein. The host may also include additional system memory, one or more input/output interfaces and/or one or more input/output devices in communication with the one or more processors, as well as other components well known in the art.

The system 100 includes at least one memory device 200, comprising a storage controller 102 and one or more memory die 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the system 100 may include two or more memory devices. Each memory device 200 may include two or more memory die 104, such as flash memory, nano random access memory ("nano RAM or NRAM"), magneto-resistive RAM ("MRAM"), dynamic RAM ("DRAM"), phase change RAM ("PRAM"), etc. In further embodiments, the data memory device 200 may include other types of non-volatile and/or volatile data storage, such as dynamic RAM ("DRAM"), static RAM ("SRAM"), magnetic data storage, optical data storage, and/or other data storage technologies.

The memory device 200, also referred to herein as a storage device, may be a component within a host device 106 as depicted in here, and may be connected using a system bus, such as a peripheral component interconnect express ("PCI-e") bus, a Serial Advanced Technology Attachment ("serial ATA") bus, or the like. In another embodiment, the memory device 200 is external to the host device 106 and is connected, a universal serial bus ("USB") connection, an Institute of Electrical and Electronics Engineers ("IEEE") 1394 bus ("FireWire"), or the like. In other embodiments, the memory device 200 is connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory module ("DIMM"), a daughter card, or a micro-module. In another embodiment, the memory device 200 is a component within a rack-mounted blade. In another embodiment, the memory device 200 is contained within a package that is integrated directly onto a higher level assembly (e.g., mother board, laptop, graphics processor). In another embodiment, individual components comprising the memory device 200 are integrated directly onto a higher level assembly without intermediate packaging.

In a further embodiment, instead of being connected directly to the host device 106 as DAS, the data memory device 200 may be connected to the host device 106 over a data network. For example, the data memory device 200 may include a storage area network ("SAN") storage device, a network attached storage ("NAS") device, a network share, or the like. In one embodiment, the system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a super computer, a computing node, a virtual computer, a hand held device, a smart phone, a cell phone, a system on a chip, a single chip computer, and the like. In another embodiment, a host device 106 may be a client and the memory device 200 operates autonomously to service data requests sent from the host device 106. In this embodiment, the host device 106 and memory device 200 may be connected using a computer network, system bus, Direct Attached Storage (DAS) or other communication means suitable for connection between a computer and an autonomous memory device 200.

The depicted embodiment shows a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In one embodiment, the user application 108 is a software application operating on or in conjunction with the storage client 110. The storage client 110 manages files and data and utilizes the functions and features of the storage controller 102 and associated memory die 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 is in communication with the storage controller 102 within the memory device 200.

In one embodiment, the system 100 includes one or more clients connected to one or more host device 106 through one or more computer networks. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, WiFi, WiMax, and the like.

The computer network 114 may include servers, switches, routers, cabling, radios, and other equipment to facilitate networking the host device 106 or host devices and host device 112 or clients. In one embodiment, the system 100 includes multiple host devices that communicate as peers over a computer network 114. In another embodiment, the system 100 includes multiple memory devices 200 that communicate as peers over a computer network 114. One of skill in the art will recognize other computer networks comprising one or more computer networks and related equipment with single or redundant connection between one or more clients or other computer with one or more memory devices 200 or one or more memory devices 200 connected to one or more host devices. In one embodiment, the system 100 includes two or more memory devices 200 connected through the computer network 114 to a host device 112 without a host device 106.

In one embodiment, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager includes specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices do not directly or necessarily associate logical addresses with particular physical data blocks. These storage devices may emulate a conventional block storage interface to maintain compatibility with a block storage client 110.

In one embodiment, the storage controller 102 provides a block I/O emulation layer, which serves as a block device interface, or API. In this embodiment, the storage client 110 communicates with the storage device through this block device interface. In one embodiment, the block I/O emulation layer receives commands and logical addresses from the storage client 110 in accordance with this block device interface. As a result, the block I/O emulation layer provides the storage device compatibility with a block storage client 110.

In one embodiment, a storage client 110 communicates with the storage controller 102 through a host device interface comprising a direct interface. In this embodiment, the storage device directly exchanges information specific to non-volatile storage devices. A storage device using direct interface may store data in the memory die 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 104.

The storage controller 102 receives a logical address and a command from the storage client 110 and performs the corresponding operation in relation to the memory die 104. The storage controller 102 may support block I/O emulation, a direct interface, or both.

Figure 2:
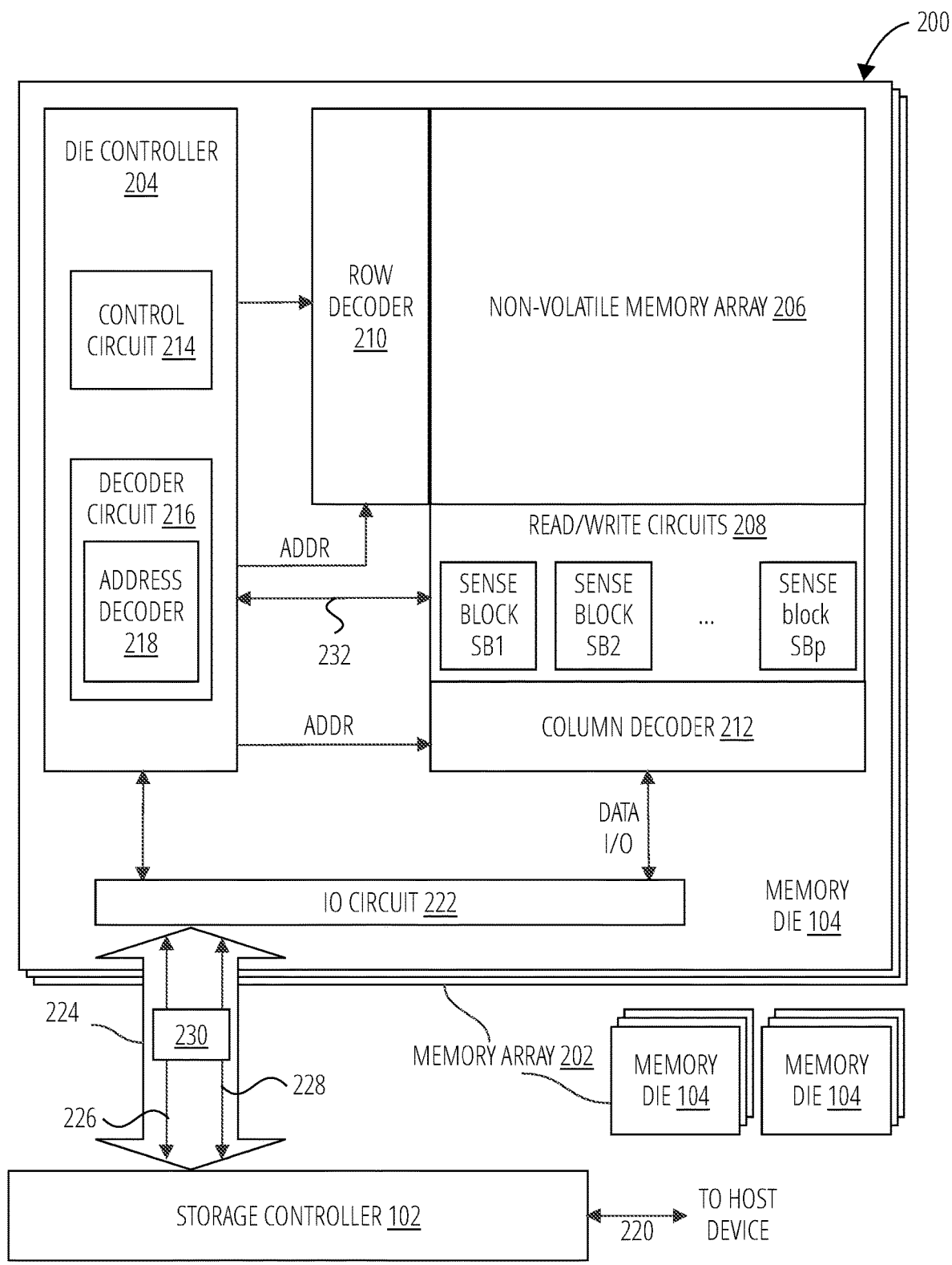
FIG. 2 illustrates a memory device 200 in accordance with one embodiment.

FIG. 2 is a block diagram of an exemplary memory device 200. The memory device 200 may include a storage controller 102 and a memory array 202 comprised of a number of memory dies 104, the storage controller 102 and memory dies 104 being effectively as described with regard to FIG. 1. Each memory die 104 in the memory array 202 may include a die controller 204 and at least one non-volatile memory array 206 in the form of a three-dimensional array, and read/write circuits 208.

In this context, "memory array" refers to a set of memory cells (also referred to as storage cells) organized into an array structure having rows and columns. A memory array is addressable using a row identifier and a column identifier, each represented as part of an address, such as a command address. Consequently, a non-volatile memory array is a memory array having memory cells configured such that a characteristic (e.g. threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The non-volatile memory array 206 is addressable by word line via a row decoder 210 and by bit line via a column decoder 212. The read/write circuits 208 include multiple sense blocks SB1, SB2, . . . , SBp (sensing circuitry) and allow a page of memory cells to be read or programmed in parallel. In certain embodiments, each memory cell across a row of the memory array together form a physical page.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In one embodiment, the memory die includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The non-volatile memory array 206 can be two-dimensional (2D—laid out in a single fabrication plane) or three-dimensional (3D—laid out in multiple fabrication planes). The non-volatile memory array 206 may comprise one or more arrays of memory cells including a 3D array. In one embodiment, the non-volatile memory array 206 may comprise a monolithic three-dimensional memory structure (3D array) in which multiple memory levels are formed above (and not in) a single substrate, such as a wafer, with no intervening substrates. The non-volatile memory array 206 may comprise any type of non-volatile memory that is monolithically formed in one or more physical levels of arrays of memory cells having an active area disposed above a silicon substrate. The non-volatile memory array 206 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 cooperates with the read/write circuits 208 to perform memory operations on memory cells of the non-volatile memory array 206 and includes a control circuit 214 and a decoder circuit 216 that may incorporate an address decoder 218. The control circuit 214 provides chip-level control of memory operations.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

"Control circuit" refers to a device, component, element, module, system, sub-system, circuitry, logic, hardware, or circuit configured and/or operational to manage one or more other circuits. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212.

Commands and data are transferred between the host device and storage controller 102 via a data bus 220, and between the storage controller 102 and an input/output (IO) circuit 222 on each of the memory dies 104 via a memory interface 224. The memory interface 224 may be a type of communication bus, comprising a control bus 226 and a data bus 228, over which fixed length command sequences 230 may be transmitted. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In one embodiment, a single data bus may be shared by a plurality of components, such as memory die. When multiple chips or memory die share a data bus, that data may be accessed or transferred by a single memory die or by all the memory die in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WE" or "WE #"), chip enable ("CE" or "CE #"), read enable ("RE" or "Re"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the non-volatile memory array 206 in order to identify a location within the non-volatile memory array 206 for a storage command. In particular, the address decoder 218 determines a row identifier and a column identifier which together identifies the location within the non-volatile memory array 206 that applies to a storage command associated with a command address. The storage command and command address are received in a fixed length command sequence.

The input/output (IO) circuit 222 may be coupled, through the memory interface 224 and the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 232 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 206 and the control circuit 214 in order to transfer data between the non-volatile memory array 206 and the input/output (IO) circuit 222 in response to the storage commands.

In some implementations, some of the components can be combined. In various designs, one or more of the components (alone or in combination), other than non-volatile memory array 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry is typically required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
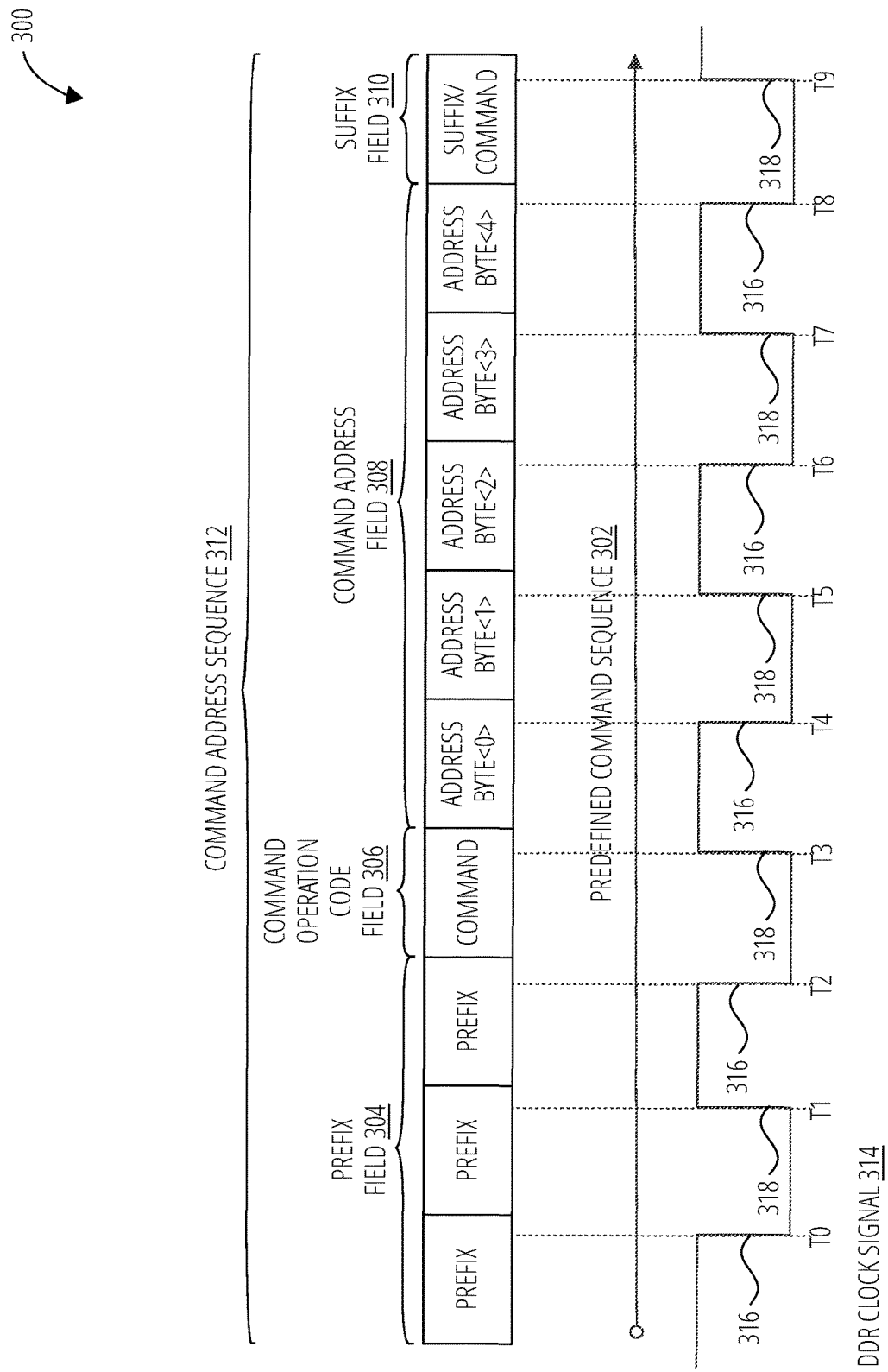
FIG. 3 illustrates a fixed length command sequence 300 in accordance with one embodiment.

FIG. 3 illustrates a fixed length command sequence 300 in accordance with one embodiment. "Fixed length command sequence" refers to a command sequence in which a size of the command sequence is fixed, set, predetermined, and/or predefined. In certain embodiments, the size that is fixed, set, predetermined, and/or predefined is a number of bytes that form the command sequence. In other embodiments, the size may be a fixed, set, predetermined, and/or predefined number of bits, words, or the like that form the command sequence. In one embodiment, a fixed length command sequence includes a predefined number of bytes used to represent a command, such as a storage command, and a predefined number of bytes used to represent a command address. Additionally, or in an alternative embodiment, a fixed length command sequence may include a predefined number of number of prefix bytes and/or a predefined number of suffix bytes. In one embodiment, the number of bytes that form the fixed length command sequence is 10 bytes. In another embodiment, the fixed length command sequence comprises 20 bytes. In yet another embodiment, the fixed length command sequence comprises 5 bytes.

The fixed length command sequence 300 may comprise a set of bytes transferred from a storage controller to an IO circuit according to a predefined command sequence 302. "Predefined command sequence" refers to a command sequence in which the command sequence includes two or more fields and the order and size of the fields (which may be 1 or more bytes) are defined as part of a communication protocol. In another embodiment, the predefined command sequence may also define a position and/or length for the fields of the fixed length command sequence.

In one embodiment, a fixed length command sequence 300, such as the example of FIG. 3, includes a prefix field 304, command operation code field 306, command address field 308, and a suffix field 310. A storage controller and IO circuit are each configured such that the various storage command fit within the fixed length of the fixed length command sequence. Certain storage commands may use each byte or bit of each prefix field 304, command operation code field 306, and suffix field 310. Other storage command may use all or part of the command operation code field 306, and not require any bytes or bits of the prefix field 304 and suffix field 310. For such storage commands, the storage controller may fill the unneeded bits or bytes with dummy data, filler data, or place holder data.

Other storage commands may use one or more of, or part of, the prefix field 304, suffix field 310, and command operation code field 306. In one embodiment, each storage command sends a command address that fills the command address field 308. In another embodiment, certain storage commands send no command address and send dummy data instead or send a partial command address that fills a portion of the command address field 308.

"Prefix field" refers to a field of a fixed length command sequence configured to signal a different mode of operation for a storage command. In certain embodiments, a prefix field may be used to indicate that a command of a fixed length command sequence is a read command. "Command operation code" refers to a number, symbol, or other value configured to signal for a receiving device which command of a set of commands the receiving device is being asked to execute. A command operation code may be stored within a command operation code field of a fixed length command sequence. "Command address field" refers to a field within a fixed length command sequence configured to hold a command address. "Suffix field" refers to a field of a fixed length command sequence configured to provide additional information in relation to a storage command of the fixed length command sequence. In certain embodiments, a suffix field may be used to indicate that a command of a fixed length command sequence is a read command.

In the example of FIG. 3, the prefix field 304 comprising three bytes, the command operation code field 306 comprises one byte, the command address field 308 comprises 5 bytes, and the suffix field 310 comprises one byte. Those of skill in the art will recognize that a fixed length command sequence may include any number of bytes or bits, as long as the total is fixed at a certain whole number. Because a fixed length command sequence has a length/size that does not change from one storage command to another, the memory interface may be simpler, include fewer clock signals, and may operate at a high data transfer rate. For example, in one embodiment the memory interface 224 may operate at a double data rate.

"Clock signal" refers to a control signal, used with synchronous digital circuits, configured to oscillate between a high state and a low state at a particular rate or frequency, measured in clock cycles, for a communication interface. Common clock signals operate such that the signal forms a square wave with a 50% duty cycle. Electronic components rely on a clock signal operating at a constant, fixed frequency.

Circuits using a clock signal for synchronization may become active at either the rising edge, falling edge, or, in the case of double data rate, both in the rising and in the falling edges of the clock cycle. (Search clock signal on Wikipedia.com Nov. 11, 2019. Modified. Accessed Feb. 20, 2020.)

In certain embodiments, a fixed length command sequence 300 that comports to the predefined command sequence 302 may include a command address with a storage command. Such embodiments may refer to the predefined command sequence 302 as a command address sequence 312. The command address sequence 312 may include at least one prefix field 304, a command operation code field 306, a command address field 308, and at least one suffix field 310. The command address field 308 may be 5 bytes, or any number of bytes, as required to properly address storage commands to a memory array, so long as the size of the command address field is fixed and not variable. In certain embodiments, the command address sequence 312 may include a command operation code field 306, a command address field 308, and no prefix field 304 and no suffix field 310. In certain embodiments, the command address sequence 312 may comprise a fixed length command sequence and/or a fixed length command address sequence.

In certain embodiments, a double data rate protocol clock signal 314 may be used to latch the data of the fixed length command sequence 300 into a decoder circuit 216 such as that introduced in FIG. 2 on both the falling clock edge 316 and rising clock edge 318. Using a double data rate protocol clock signal 314 enables the transfer of twice as many bytes of a command address sequence 312 as using a single data rate protocol. By using the double data rate protocol clock signal 314 the transfer speed for command address sequence 312/predefined command sequence 302 is doubled. Those of skill in the art appreciate that the storage controller 102 and the input/output (JO) circuit 222 are adapted to support and operate at the double data rate protocol clock signal 314 for a double data rate protocol.

In an embodiment such as that described with respect to the data bus 228 of FIG. 2, the eight bits of each byte of the predefined command sequence 302 may be transferred and latched in parallel. Thus, the ten bytes of the fixed length command sequence 300 may be latched in the order of the predefined command sequence 302 within ten clock edges, from time T0 to T1, as shown. In one embodiment, the double data rate protocol clock signal 314 used by the data bus may operate at a speed of 2 nanoseconds (ns) per clock cycle. With the IO circuit, such as input/output (IO) circuit 222, configured to latch data from the data bus using a double data rate protocol, the fixed length command sequence 300 may be latched within 10 ns, representing an improvement over the 70 ns to 100 ns period conventional solutions may take.

Figure 4:
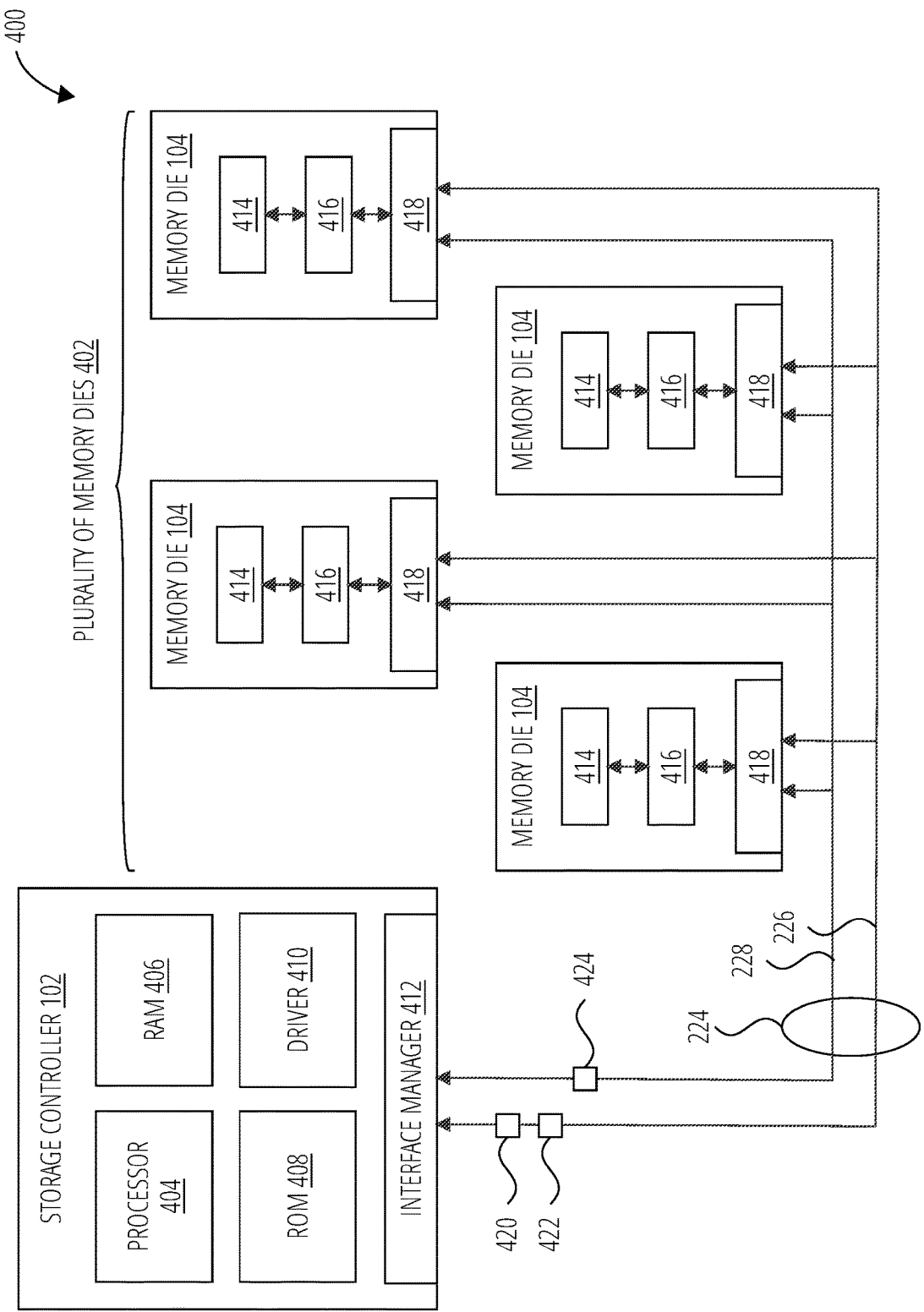
FIG. 4 is a block diagram of an example memory system 400 in accordance with one embodiment.

FIG. 4 illustrates a memory system 400 in accordance with one embodiment. The memory system 400 may comprise a storage controller 102 coupled to a plurality of memory dies 402 via a memory interface 224 comprising a control bus 226 and a data bus 228. The storage controller 102 is coupled to each memory die 104, and the memory interface 224 may function as described with regard to FIG. 1 and FIG. 2. The storage controller 102 may further comprise a processor 404, a RAM 406, a ROM 408, a driver 410, and an interface manager 412. Each memory die 104 may comprise non-volatile memory 414, a die controller 416, and a die interface manager 418.

"Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

"Driver" refers to a circuit, sub-circuit, electronic component, hardware, software, firmware, module, logic, device, or apparatus configured, programmed, designed, arranged, or engineered to supply a voltage, either in analog or digital wave form, to another circuit, sub-circuit, electronic component, logic, device, or apparatus.

In another embodiment, a driver may supply a current to another circuit or component at a predefined level/magnitude. Often, a single driver, also referred to herein as a "driver circuit," is configured to supply a voltage and/or current at one of a plurality of predefined levels or magnitudes, based on control signals provided to the driver.

The interface manager 412 may allow the storage controller 102 to communicate over the memory interface 224 in order to transfer data and/or fixed length command address sequences, such as the fixed length command sequence 300 introduced earlier. In one embodiment, the interface manager 412 may set a value for one of the prefix fields of the fixed length command address sequence in response to the storage command of the fixed length command address sequence comprising a read command. "Fixed length command address sequence" refers to a specific type of fixed length command sequence that includes a command sequence and a command address.

The die controller 416 of each memory die 104 may couple to, or include, a die interface manager 418 that communicates with the storage controller 102 over the memory interface 224. The interface manager 412 and the die interface managers 418 may transfer the fixed length command address sequence over the data bus 228 using a double data rate protocol.

The data bus 228 may comprise a double data rate protocol clock signal 424 configured to operate at a speed of 2 ns per clock cycle. The control bus 226 may include a chip enable control signal 420 and a command control signal 422. "Command control signal" refers to a signal sent over a control line and configured to manage operation of an electronic device such as a memory die, die controller, or the like. The command control signal 422 may identify whether data on the data bus 228 represents a storage command or data, such as user data.

In one embodiment, the control bus 226 may consist of only a chip enable control signal 420 and a command control signal 422. In certain embodiment, having a control bus 226 made up of only chip enable control signal 420 and command control signal 422 may enable the memory system 400 to be designed with fewer control bus control line and few associated pads. For example, the memory system 400 may not use a WE control line because the command sequence is transferred using a fixed length command sequence. By using a fixed length command sequence, the memory system 400 may also be able to operate at a higher data transfer speed, such as with a double data rate protocol.

In one embodiment, the interface manager 412 tunes the memory interface 224 to determine appropriate interface settings for transferring data, with an acceptable signal integrity and bit error rate and data transfer speed. "Interface settings" refers to a parameter for, or related to, interacting with, using, operating, or managing a communication interface, such as a memory interface. The interface settings may relate to settings configured to ensure accurate sending and receiving of data and/or control signals between a sender and a receiver.

For an interface that uses a set of control lines to communicate the data and signals, the interface settings may include parameters, values, and settings that adjust the operation of the interface to improve the performance, the fidelity, and the signal integrity of the interface. Some examples of settings that may be interface settings includes, but is not limited to, impedance (ZQ) matching settings, on-die termination (ODT) settings, such as delay settings, duty-cycle correction settings, interface clock speed settings, and the like. In certain embodiments, interface settings may be defined and or adjusted to account for differences in circuits or components that result from process manufacturing variances, changes in voltages used or available, and changes in temperature in which the sender and/or receiver operate.

The interface settings may be set once during initialization of a sender and/or receiver configured to use the associated interface, dynamically with each command issued by way of the interface, or during operation of the sender and receiver using the interface in response to triggers such as events, time intervals, conditions that meet thresholds, and the like.

"Bit error rate" refers to a measure of a number of bits in error of a total overall number of bits processed. In certain embodiments, a bit error rate is calculated after an Error Correction Code (ECC) decoder has made one or more attempts to correct one or more bits in error.

"Data transfer speed" refers to a measure of a rate at which data is transferred between a source and a destination relative to a unit of time, typically seconds or portions of seconds. A data transfer speed may be expressed in terms of the number of clock cycles of a clock signal, such as a strobe signal, of a communication interface, such as a data bus. A data transfer speed may be expressed in terms of the amount of data in Mega Bytes transferred per unit of time, such as seconds. For example, one data transfer speed may be 533 MB/s.

Those of skill in the art will recognize that the interface manager 412 may determine interface settings for storage cells configured to store any number of bits per storage cell, such as 2, 3, 4, 5, 6, 7, 8, and the like. Similarly, embodiments of the disclosed solution may change the interface settings, as needed based on the number of bits the storage cells involved in the storage operation are configured to store.

Figure 5:
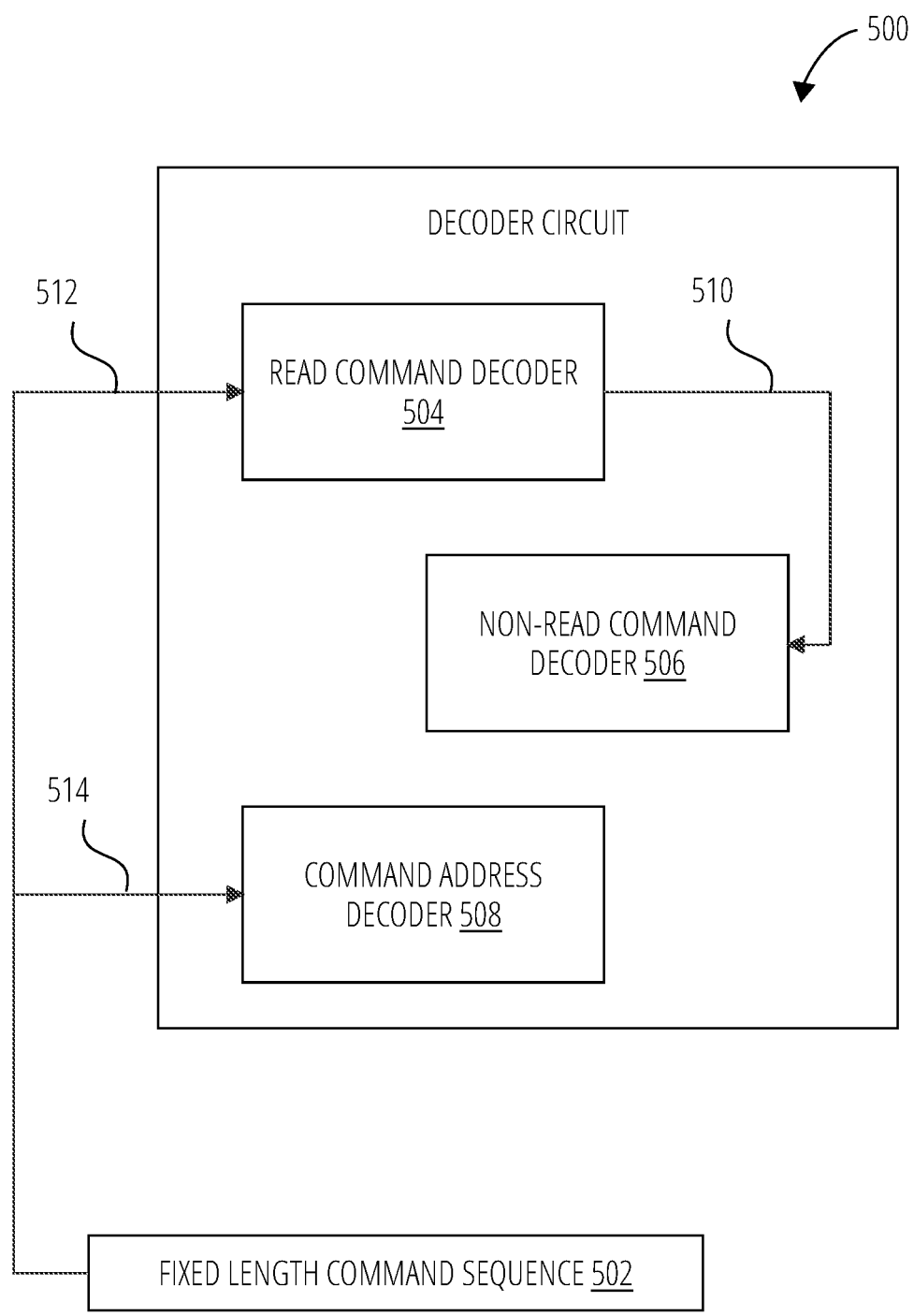
FIG. 5 illustrates a decoder circuit 500 in accordance with one embodiment.

FIG. 5 illustrates a decoder circuit 500 in accordance with one embodiment. The decoder circuit 500 may operate within a die controller, or in connection with a die controller of a memory system 400. A decoder circuit 500 decodes a command address and a storage command from a fixed length command sequence received by an IO circuit over a data bus. In certain embodiments, a decoder circuit 500 may reside within each of the die controllers 416.

In one embodiment, the decoder circuit 500 may comprise a read command decoder 504, a non-read command decoder 506, and a command address decoder 508. "Read command decoder" refers to a decoder configured specifically to decode read commands from a storage controller to a memory die.

The decoder circuit 500 may decode storage commands from a fixed length command sequence 502. The decoder circuit 500 may then instruct the read command decoder 504 or non-read command decoder 506 to decode a storage command based on a storage command type for a particular storage command.

The read command decoder 504 may be configured specifically to decode read commands 512 and no other types of storage commands. The non-read command decoder 506 may be configured specifically to decode non-read commands 510. In certain embodiments, the read command decoder 504 may decode read commands faster than the non-read command decoder 506 decodes non-read commands 510. The decoder circuit 500 may route non-read commands 510

In one embodiment, the decoder circuit 500 may provide both read commands 512 and non-read commands 510 to the read command decoder 504. If the storage command is a read command, then the read command decoder 504 decodes the storage command. If the storage command is a non-read storage command, then the non-read command decoder 506 decodes the storage command.

The decoder circuit 500 may use a variety of mechanisms to determine which decoder to use for a fixed length command sequence 502. In one embodiment, the decoder circuit 500 routes storage commands to one of the read command decoder 504 and the non-read command decoder 506 based on a prefix field. For example, in one embodiment, the decoder circuit 500 may route read commands to the read command decoder 504 in response to on at least one prefix field of a fixed length command sequence 502 having a value indicating that the storage command is a read command. In one embodiment, the value indicating that the storage command is a read command may comprise a high performance read flag. When implemented as part of the prefix field (or it could be part of a suffix field), the high performance read flag may be used to route the fixed length command sequence to a high performance read command decoder, which may, for example, be a special purpose, dedicated, single function read command decoder.

The read command decoder 504 may be designed to decode read commands 512 faster than the non-read command decoder 506 decodes storage commands that are non-read commands 510. The command address decoder 508 may decode a command address 514 from the fixed length command sequence 502, such as a command address communicated in a command address field 308.

Figure 6:
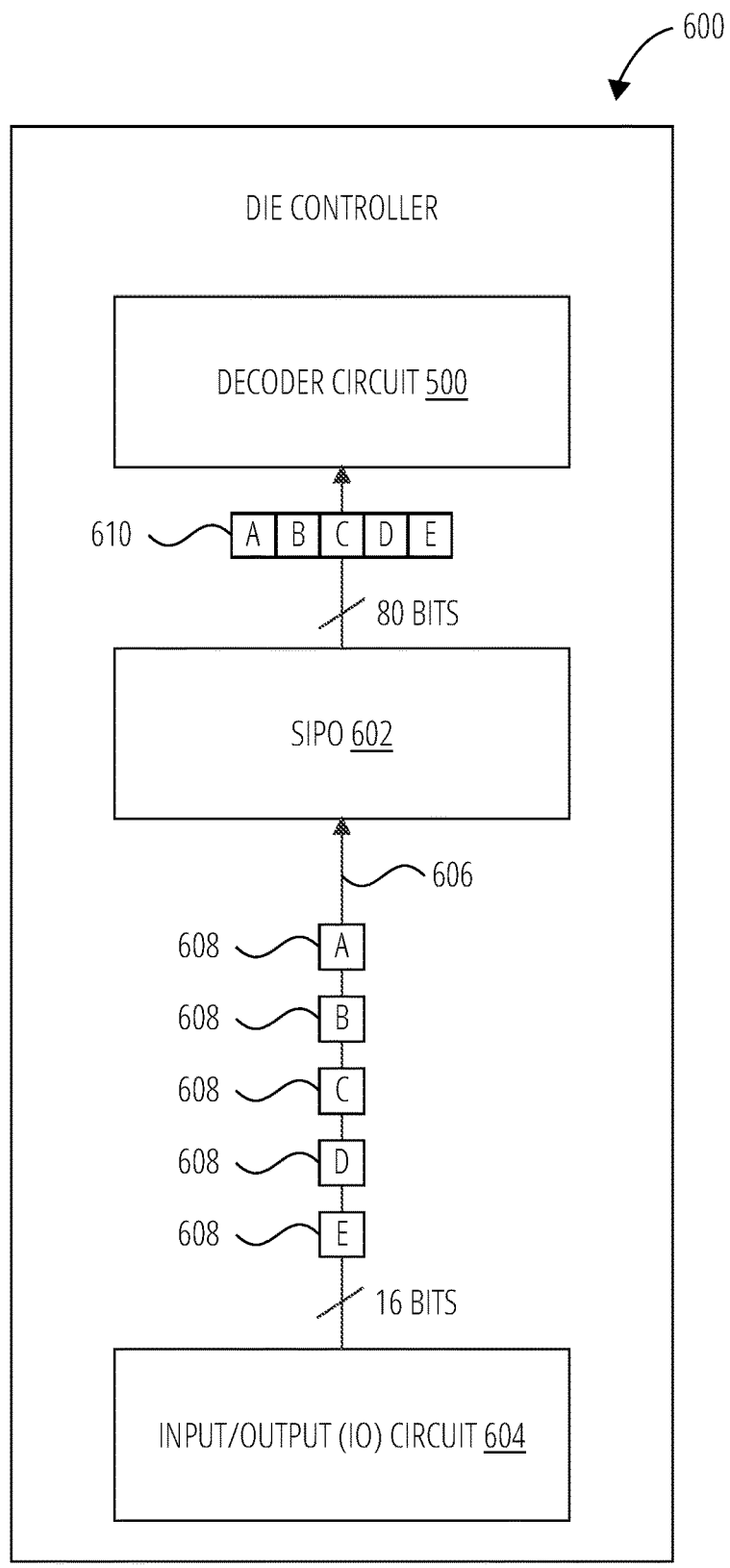
FIG. 6 illustrates a die controller 600 in accordance with one embodiment.

FIG. 6 illustrates a die controller 600 in accordance with one embodiment. The die controller 600 comprises a decoder circuit 500, a SIPO circuit 602, and an Input/Output (IO) circuit 604. These elements may be implemented as circuitry within the die controller 600.

In embodiments, such as that described in relation to FIG. 2, the memory interface operates at a double data rate protocol and with a fast cycle time of 2 nanoseconds. Consequently, a data transfer speed for the memory interface is faster than has been used in the past. These faster speeds are made possible by using a faster driver/clock signal, double data rate protocol, and a fixed length command sequence. In certain embodiments, latches, buffers, receiving circuits, and decoders of a memory die may have certain setup and hold times in order to properly decode and respond to storage commands.

The SIPO circuit 602 may serve as a buffer to facilitate processing and decoding of such storage commands received over the memory interface at the higher data transfer speeds. The serial-in parallel out (SIPO) circuit or SIPO circuit 602 coupled between the Input/Output (IO) circuit 604 and the decoder circuit 500 may accept sixteen bits on a set of input control lines 606. The SIPO circuit 602 may then output eighty bits in parallel. Thus, the SIPO circuit 602 is configured to buffer five sets of fixed length command sequence which can then be passed on to a decoder circuit 500 for processing and handling.

In this manner, the SIPO circuit 602 may convert a 16-bit fixed length command sequence 608 received from the Input/Output (IO) circuit 604 according to a double data rate protocol into an 80-bit command address sequence 610. The SIPO circuit 602 may then transfer the 80-bit command address sequence 610 to the decoder circuit 500.

Figure 7:
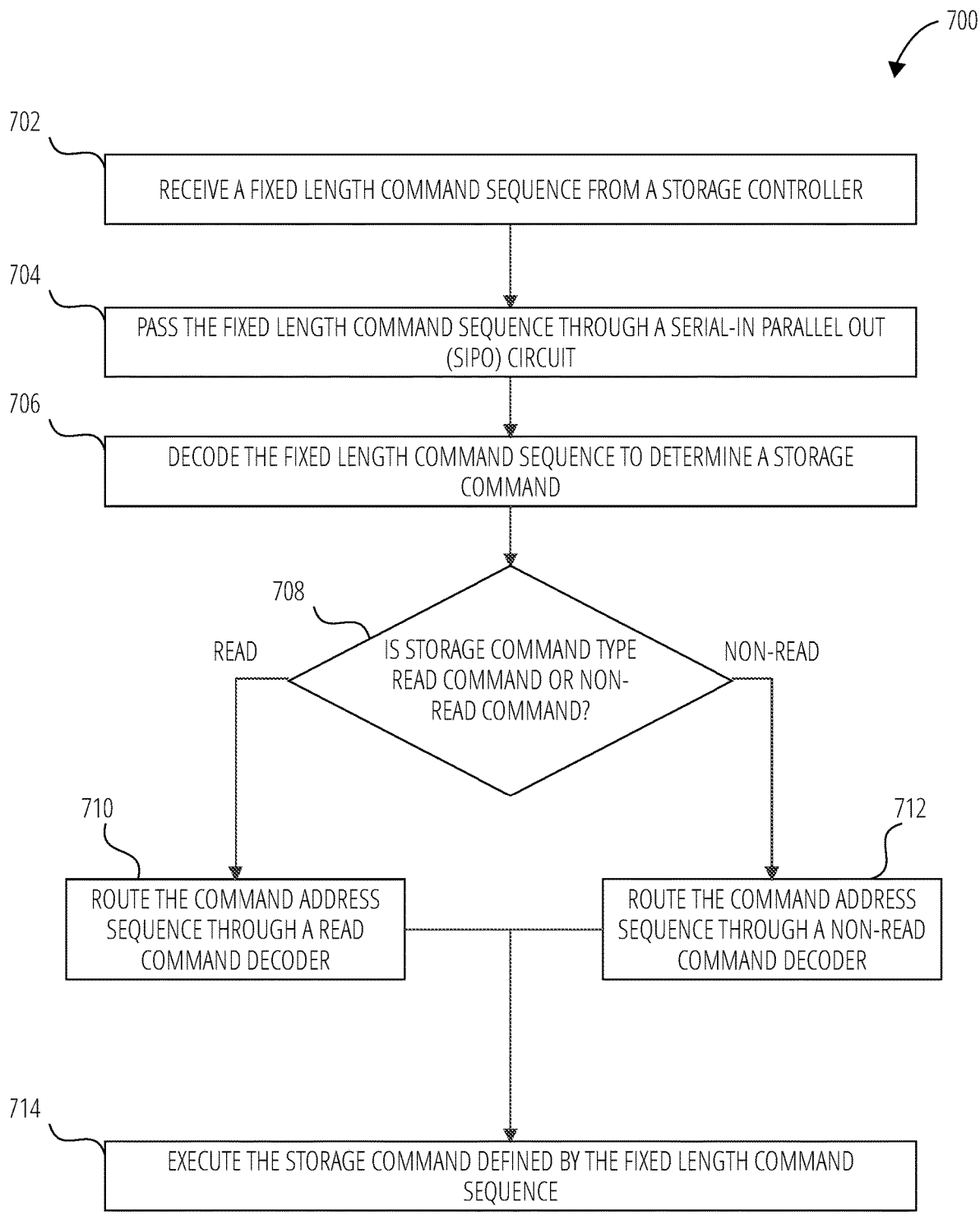
FIG. 7 illustrates a routine 700 in accordance with one embodiment.

FIG. 7 illustrates a routine 700 for implementing the disclosed solution in accordance with one embodiment. A fixed length command sequence may first be received from a storage controller in block 702. The fixed length command sequence may be sent over a data bus using a double data rate protocol. The fixed length command sequence may be received in response to a command control signal identifying whether the data on the data bus is a storage command or data.

The routine 700 may pass the fixed length command sequence through a serial-in parallel out (SIPO) circuit in block 704. The serial-in parallel out (SIPO) circuit may convert five 16-bit fixed length command sequences into one 80-bit command address sequence. The 80-bit command address sequence may be a fixed length command address sequence, which may include a 5-byte command address field, a 1-byte command operation code field, up to three prefix fields taking up 3 bytes, and a 1-byte suffix field. At block 706, the fixed length command sequence may be decoded to produce the storage command identified by the fixed length command sequence.

At decision block 708, the 80-bit command address sequence may be examined for a value indicating whether the storage command is a read command or a non-read command. If the command address sequence represents a read command, the routine 700 passes to block 710. If the 80-bit command address sequence is a non-read command, the routine 700 passes to block 712.

At block 710, if the 80-bit command address sequence includes a read command, the command address sequence is sent to a read command decoder. The read command decoder may then implement the read command. At block 712, if the 80-bit command address sequence is a non-read command, it may be sent to a non-read command decoder. The non-read command decoder may then implement the non-read command. In certain embodiments, the routine 700 may include bypassing a read command decoder at block 712. At block 714, the routine 700 ends with execution of the storage command defined by the fixed length command sequence. This routine 700 may be implemented by the circuit and system described with respect to FIG. 1 through FIG. 6.

Figure 8:
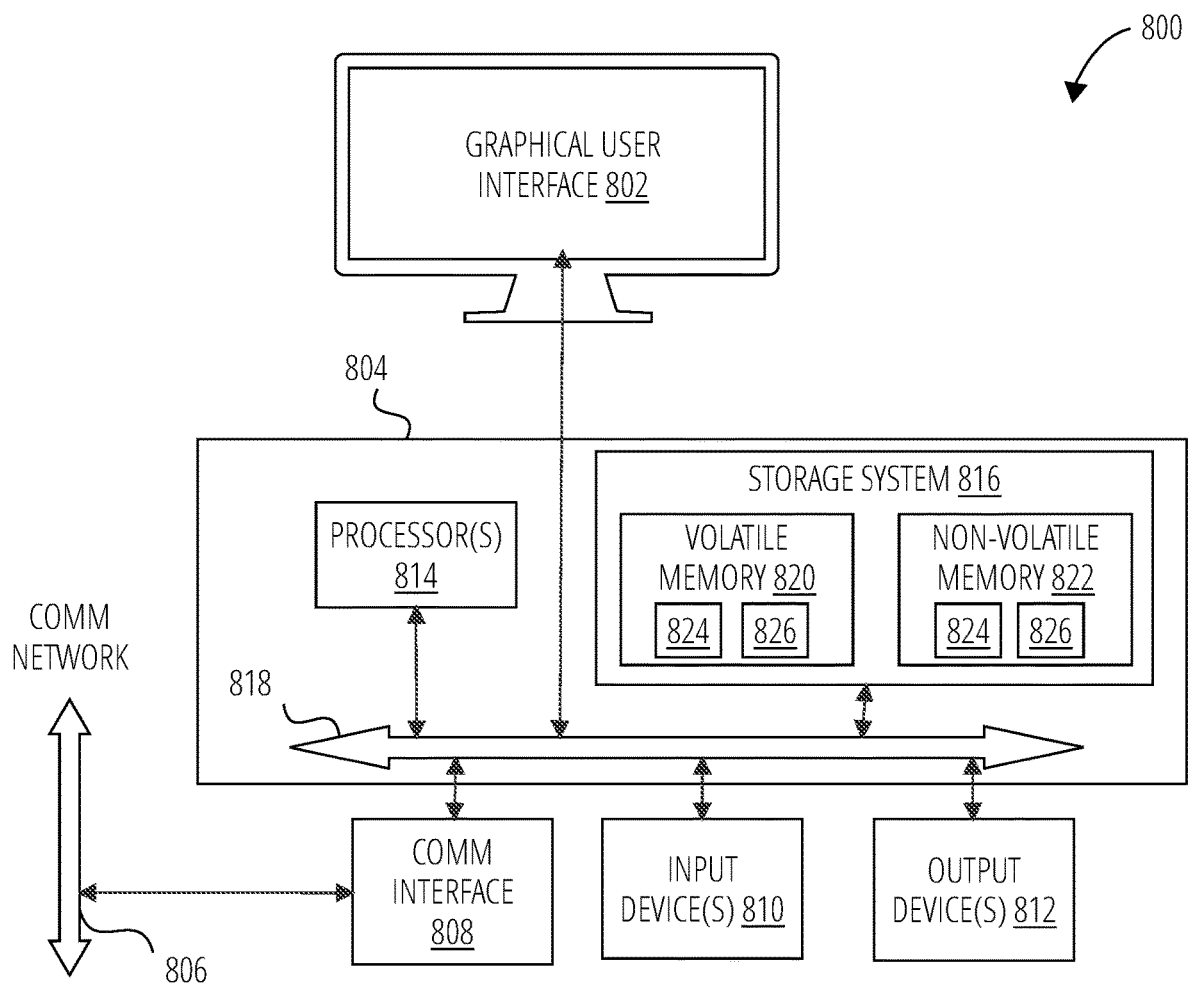
FIG. 8 is an example block diagram of a computing device 800 that may be used in one embodiment.

FIG. 8 is an example block diagram of a computing device 800 that may incorporate embodiments of the claimed solution. FIG. 8 is merely illustrative of a machine system to carry out aspects of the technical processes described herein and does not limit the scope of the claims. One of ordinary skill in the art would recognize other variations, modifications, and alternatives. In certain embodiments, the computing device 800 includes a graphical user interface 802, a data processing system 804, a communication network 806, communication network interface 808, input device(s) 810, output device(s) 812, and the like.

As depicted in FIG. 8, the data processing system 804 may include one or more processor(s) 814 and a storage system 816.

The processor(s) 814 communicate with a number of peripheral devices via a bus subsystem 818. These peripheral devices may include input device(s) 810, output device(s) 812, communication network interface 808, and the storage system 816. The storage system 816, In one embodiment, comprises one or more storage devices and/or one or more memory devices. The term "storage device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

In one embodiment, the storage system 816 includes a volatile memory 820 and a non-volatile memory 822. The term "volatile memory" refers to a shorthand name for volatile memory media. In certain embodiments, volatile memory refers to the volatile memory media and the logic, controllers, processor(s), state machine(s), and/or other periphery circuits that manage the volatile memory media and provide access to the volatile memory media.

The term "non-volatile memory" refers to shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media. The volatile memory 820 and/or the non-volatile memory 822 may store computer-executable instructions 826 that alone or together form logic 824 that when applied to, and executed by, the processor(s) 814 implement embodiments of the processes disclosed herein. The term "logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The input device(s) 810 include devices and mechanisms for inputting information to the data processing system 804. These may include a keyboard, a keypad, a touch screen incorporated into the graphical user interface 802, audio input devices such as voice recognition systems, microphones, and other types of input devices. In various embodiments, the input device(s) 810 may be embodied as a computer mouse, a trackball, a track pad, a joystick, wireless remote, drawing tablet, voice command system, eye tracking system, and the like. The input device(s) 810 typically allow a user to select objects, icons, control areas, text and the like that appear on the graphical user interface 802 via a command such as a click of a button or the like.

The output device(s) 812 include devices and mechanisms for outputting information from the data processing system 804. These may include the graphical user interface 802, speakers, printers, infrared LEDs, and so on, as well understood in the art. In certain embodiments, the graphical user interface 802 is coupled to the bus subsystem 818 directly by way of a wired connection. In other embodiments, the graphical user interface 802 couples to the data processing system 804 by way of the communication network interface 808. For example, the graphical user interface 802 may comprise a command line interface on a separate computing device 800 such as desktop, server, or mobile device.

The communication network interface 808 provides an interface to communication networks (e.g., communication network 806) and devices external to the data processing system 804. The communication network interface 808 may serve as an interface for receiving data from and transmitting data to other systems. Embodiments of the communication network interface 808 may include an Ethernet interface, a modem (telephone, satellite, cable, ISDN), (asynchronous) digital subscriber line (DSL), FireWire, USB, a wireless communication interface such as Bluetooth or WiFi, a near field communication wireless interface, a cellular interface, and the like.

The communication network interface 808 may be coupled to the communication network 806 via an antenna, a cable, or the like. In some embodiments, the communication network interface 808 may be physically integrated on a circuit board of the data processing system 804, or in some cases may be implemented in software or firmware, such as "soft modems", or the like.

The computing device 800 may include logic that enables communications over a network using protocols such as HTTP, TCP/IP, RTP/RTSP, IPX, UDP and the like.

The volatile memory 820 and the non-volatile memory 822 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 820 and the non-volatile memory 822 may be configured to store the basic programming and data constructs that provide the functionality of the disclosed processes and other embodiments thereof that fall within the scope of the claimed solution.

Logic 824 that implements one or more parts of embodiments of the solution may be stored in the volatile memory 820 and/or the non-volatile memory 822. Logic 824 may be read from the volatile memory 820 and/or non-volatile memory 822 and executed by the processor(s) 814. The volatile memory 820 and the non-volatile memory 822 may also provide a repository for storing data used by the logic 824.

"Module" refers to a computer code section having defined entry and exit points. Examples of modules are any software comprising an application programming interface, drivers, libraries, functions, and subroutines. "Software" refers to logic implemented as processor-executable instructions in a machine memory (e.g. read/write volatile memory media or non-volatile memory media). "Computer code section" refers to one or more instructions. "Application programming interface" refers to instructions implementing entry points and return values to a module.

"Instructions" refers to symbols representing commands for execution by a device using a processor, microprocessor, controller, interpreter, or other programmable logic. Broadly, 'instructions' can mean source code, object code, and executable code. 'instructions' herein is also meant to include commands embodied in programmable read-only memories (EPROM) or hard coded into hardware (e.g., 'micro-code') and like implementations wherein the instructions are configured into a machine memory or other hardware component at manufacturing time of a device.

"Source code" refers to a high-level textual computer language that requires either interpretation or compilation in order to be executed by a device.

"Object code" refers to the computer code output by a compiler or as an intermediate output of an interpreter. Object code often takes the form of machine language or an intermediate language such as register transfer language (RTL).

"Executable code" refers to instructions in a ready-to-execute form by a programmable device. For example, source code instructions in non-interpreted execution environments are not executable code because they must usually first undergo compilation, linking, and loading by the operating system before they have the proper form for execution. Interpreted computer code may be considered executable code because it can be directly applied to a programmable device (an interpreter) for execution, even though the interpreter itself may further transform the interpreted computer code into machine language instructions.

"Programmable device" refers to any logic (including hardware and software logic) who's operational behavior is configurable with instructions.

"Interpreter" refers to an interpreter is logic that directly executes instructions written in a source code scripting language, without requiring the instructions to a priori be compiled into machine language. An interpreter translates the instructions into another form, for example into machine language, or into calls to internal functions and/or calls to functions in other software modules.

The volatile memory 820 and the non-volatile memory 822 may include a number of memories including a main random-access memory (RAM) for storage of instructions and data during program execution and a read only memory (ROM) in which read-only non-transitory instructions are stored. The volatile memory 820 and the non-volatile memory 822 may include a file storage subsystem providing persistent (non-volatile) storage for program and data files. The volatile memory 820 and the non-volatile memory 822 may include removable storage systems, such as removable flash memory.

The bus subsystem 818 provides a mechanism for enabling the various components and subsystems of data processing system 804 communicate with each other as intended. Although the communication network interface 808 is depicted schematically as a single bus, some embodiments of the bus subsystem 818 may utilize multiple distinct busses.

It will be readily apparent to one of ordinary skill in the art that the computing device 800 may be a device such as a smartphone, a desktop computer, a laptop computer, a rack-mounted computer system, a computer server, or a tablet computer device. As commonly known in the art, the computing device 800 may be implemented as a collection of multiple networked computing devices. Further, the computing device 800 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

Herein, references to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:
1. A circuit, comprising:
a non-volatile memory array coupled to an address decoder configured to identify a location within the non-volatile memory array for a storage command;
an Input/Output (IO) circuit coupled to a data bus;
a decoder circuit coupled to a control bus and the IO circuit, the decoder circuit configured to decode a command address and the storage command from a fixed length command sequence received by the IO circuit over the data bus;
a control circuit coupled to the IO circuit and the decoder circuit, the control circuit configured to generate control signals to execute the storage commands decoded by the decoder circuit; and
a read/write circuit coupled to the non-volatile memory array and the control circuit, the read/write circuit configured to transfer data between the non-volatile memory array and the IO circuit in response to the storage commands.
2. The circuit of claim 1, wherein the data bus comprises a clock signal configured to operate at a speed of 2 nanoseconds per clock cycle and the IO circuit is configured to latch data from the data bus using a double data rate protocol.

3. The circuit of claim 1, wherein the control bus consists of a chip enable control signal and a command control signal, the command control signal configured to identify whether data on the data bus represents the storage command or data.

4. The circuit of claim 1, wherein the data bus comprises eight control lines each configured to transfer one bit in parallel across the data bus and the fixed length command sequence comprises a set of bytes transferred from a storage controller to the IO circuit according to a predefined command sequence.

5. The circuit of claim 4, wherein the predefined command sequence comprises a command address sequence.

6. The circuit of claim 4, wherein the set of bytes comprises ten bytes.

7. The circuit of claim 1, wherein the decoder circuit is configured to:
decode the storage command from the fixed length command sequence;
instruct one of a read command decoder and a non-read command decoder to decode the storage command based on a storage command type;
wherein the decoder circuit further comprises:
a command address decoder configured to decode a command address from the fixed length command sequence; and
wherein the read command decoder is configured to decode read commands and the non-read command decoder configured to decode the storage commands that are not the read commands.

8. The circuit of claim 7, wherein the read command decoder is configured to decode the read commands faster than the non-read command decoder decodes the storage commands that are not read commands.

9. The circuit of claim 1, further comprises a serial-in parallel out (SIPO) circuit coupled between the IO circuit and the decoder circuit, the SIPO circuit configured to convert a 16-bit fixed length command sequence from the IO circuit received according to a double data rate protocol into an 80-bit command address sequence and transfer the 80-bit command address sequence to the decoder circuit.

10. A system, comprising:
a plurality of memory dies each coupled to a memory interface comprising a data bus and a control bus; and
a storage controller coupled to the plurality of memory dies by the memory interface, the storage controller comprising an interface manager configured to transfer data and a fixed length command address sequence to the plurality of memory dies by way of the memory interface;
wherein each of the plurality of memory dies include a die controller having a die interface manager configured to communicate with the storage controller over the memory interface; and
wherein the interface manager of the storage controller and the die interface managers of the plurality of memory dies are configured to transfer the fixed length command address sequence over the data bus using a double data rate protocol and the data bus comprises a clock signal configured to operate at a speed of 2 nanoseconds per clock cycle.

11. The system of claim 10, wherein each die controller of the plurality of memory dies comprises:
an address decoder configured to identify a location within a non-volatile memory array for a storage command;
an Input/Output (IO) circuit coupled to the data bus;
a decoder circuit coupled to the control bus and the IO circuit, the decoder circuit configured to decode a command address and the storage command from the fixed length command address sequence received by the IO circuit over the data bus;
a control circuit coupled to the IO circuit and the decoder circuit, the control circuit configured to generate control signals to execute the storage commands decoded by the decoder circuit; and
a read/write circuit coupled to the non-volatile memory array and the control circuit, the read/write circuit configured to transfer data between the non-volatile memory array and the IO circuit in response to the storage commands.

12. The system of claim 11, wherein the decoder circuit comprises a non-read command decoder, a read command decoder, and a command address decoder and wherein the decoder circuit is configured to route the storage command to a read command decoder in response to at least one prefix field of the fixed length command sequence having a value configured to indicate that the storage command is a read command; wherein the read command decoder is configured to operate faster than the non-read command decoder.

13. The system of claim 11, wherein the die controller comprises a serial-in parallel out (SIPO) circuit coupled between the IO circuit and the decoder circuit, the serial-in parallel out (SIPO) circuit configured to accept sixteen bits on a set of input control lines and output eighty bits of command address sequence and deliver the eighty bit command address sequence to the decoder circuit.

14. The system of claim 10, wherein the fixed length command address sequence comprises a command address field, a command operation code field, one or more prefix fields, one or more suffix fields.

15. The system of claim 14, wherein the command address field comprises five bytes, the command operation code field comprises one byte, the one or more prefix fields comprise three bytes, and the one or more suffix fields comprises one byte.

16. The system of claim 10, wherein the interface manager of the storage controller is configured to set a value for one of the one or more prefix fields in response to a storage command of the fixed length command address sequence comprising a read command.

17. A method, comprising:
receiving a fixed length command sequence from a storage controller using a double data rate protocol, over a data bus in response to a command control signal, the command control signal configured to identify whether data on the data bus represents one of a storage command and data;
decoding the fixed length command sequence to determine a storage command identified by the fixed length command sequence; and
executing the storage command defined by the fixed length command sequence.

18. The method of claim 17, wherein decoding the fixed length command sequence comprises:
passing the fixed length command sequence through a serial-in parallel out (SIPO) circuit to convert five 16-bit fixed length command sequences into one eighty bit command address sequence; and
routing the one eighty bit command address sequence through a read command decoder configured to implement a read command in response to the eighty bit command address sequence comprising a value indicating that a storage command of the eighty bit command address sequence is a read command.

19. The method of claim 18, further comprising routing the one eighty bit command address sequence through a non-read command decoder in response to the eighty bit command address sequence comprising the value indicating that the storage command of the eighty bit command address sequence is not the read command.

20. The method of claim 18, wherein a fixed length command address sequence comprises a five byte command address field, a one byte command operation code field, three bytes for each of three prefix fields, and one byte for a suffix field.

* * * * *